United States Patent
Kim et al.

(10) Patent No.: US 11,193,981 B2
(45) Date of Patent: Dec. 7, 2021

(54) APPARATUS AND METHOD FOR CALCULATING INSULATION RESISTANCE OF BATTERY

(71) Applicant: LG Chem, Ltd., Seoul (KR)

(72) Inventors: Ji-Hoon Kim, Daejeon (KR); Chang-Hyun Sung, Daejeon (KR)

(73) Assignee: LG Chem, Ltd.

( * ) Notice: Subject to any disclaimer, the term of this patent is extended or adjusted under 35 U.S.C. 154(b) by 781 days.

(21) Appl. No.: 16/068,512

(22) PCT Filed: Oct. 11, 2017

(86) PCT No.: PCT/KR2017/011184
§ 371 (c)(1),
(2) Date: Jul. 6, 2018

(87) PCT Pub. No.: WO2018/093045
PCT Pub. Date: May 24, 2018

(65) Prior Publication Data
US 2019/0011504 A1    Jan. 10, 2019

(30) Foreign Application Priority Data

Nov. 16, 2016  (KR) .................. 10-2016-0152758

(51) Int. Cl.
*G01R 31/36* (2020.01)
*G01R 27/14* (2006.01)
(Continued)

(52) U.S. Cl.
CPC ........... *G01R 31/389* (2019.01); *G01R 27/02* (2013.01); *G01R 27/025* (2013.01); *G01R 27/08* (2013.01); *G01R 27/14* (2013.01); *G01R 31/36* (2013.01)

(58) Field of Classification Search
None
See application file for complete search history.

(56) References Cited

U.S. PATENT DOCUMENTS

2010/0237872 A1* 9/2010 Kang .................... H01M 10/48
324/429
2013/0027049 A1   1/2013 Sukup
(Continued)

FOREIGN PATENT DOCUMENTS

CN    103033729 A    4/2013
CN    103048545 A    4/2013
(Continued)

OTHER PUBLICATIONS

Cheng Kaiming, "Recitation of the theory and method for preprocessing the statistical data," Statistics & Information Forum, Nov. 30, 2007, pp. 98-103, vol. 22, No. 6.
(Continued)

*Primary Examiner* — Patrick Assouad
*Assistant Examiner* — Haidong Zhang
(74) *Attorney, Agent, or Firm* — Lerner, David, Littenberg, Krumholz & Mentlik, LLP

(57) ABSTRACT

An insulation resistance calculation apparatus according to an embodiment of the present disclosure includes a switching unit including a first switch and a second switch that are independently controlled, a first protective resistor and a first reference resistor connected in series between a positive electrode terminal of a battery and a ground when the first switch is turned on, a second protective resistor and a second reference resistor connected in series between a negative electrode terminal of the battery and the ground when the second switch is turned on, a voltage measuring unit configured to measure a first detection voltage applied to the first reference resistor and a second detection voltage applied to the second reference resistor, and a processor configured to determine if a measurement error occurred in measured values of the first detection voltage and measured values of the second detection voltage.

10 Claims, 16 Drawing Sheets

(51) Int. Cl.
*G01R 31/389* (2019.01)
*G01R 27/02* (2006.01)
*G01R 27/08* (2006.01)

(56) References Cited

U.S. PATENT DOCUMENTS

| | | |
|---|---|---|
| 2013/0314097 A1 | 11/2013 | Hausberger et al. |
| 2014/0084933 A1 | 3/2014 | Jang et al. |
| 2014/0095093 A1 | 4/2014 | Hong et al. |
| 2014/0159908 A1* | 6/2014 | Hong ................ G01R 31/1227 340/636.1 |
| 2017/0016951 A1 | 1/2017 | Sung et al. |
| 2018/0024200 A1* | 1/2018 | Hiwa ................ G01R 31/3842 702/63 |

FOREIGN PATENT DOCUMENTS

| | | |
|---|---|---|
| CN | 103688183 A | 3/2014 |
| CN | 104220886 A | 12/2014 |
| JP | 4064292 B2 | 3/2008 |
| KR | 10-2013-0127828 A | 11/2013 |
| KR | 10-1388466 B1 | 4/2014 |
| KR | 20160039987 A | 4/2016 |
| KR | 10-1622193 B1 | 5/2016 |
| WO | 2016053055 A1 | 4/2016 |

OTHER PUBLICATIONS

International Search Report and Written Opinion for PCT/KR17/11184, dated Jan. 18, 2018 (9 pages)(with partial Engl. translation).
Chinese Search Report for Application No. 201780006008.0 dated Mar. 23, 2020, 2 pages.
Chinese Search Report for Application No. 201780006008.0 dated Oct. 21, 2020, 1 page.

* cited by examiner

APPARATUS AND METHOD FOR CALCULATING INSULATION RESISTANCE OF BATTERY

TECHNICAL FIELD

The present application claims priority to Korean Patent Application No. 10-2016-0152758 filed in the Republic of Korea on Nov. 16, 2016, the disclosures of which are incorporated herein by reference.

The present disclosure relates to an apparatus and method for calculating insulation resistance, and more particularly, to an apparatus and method for calculating insulation resistance of a battery rapidly and accurately in consideration of stray capacitance of the battery.

BACKGROUND

Recently, there is dramatically growing demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries are gaining attention due to advantages of charging and discharging freely in the absence of a memory effect, a very low self-discharge rate, and high energy density as compared to nickel-based secondary batteries.

Meanwhile, in some cases, the secondary battery is used as a single secondary battery, but in many cases, to provide a high voltage and/or high capacity power storage apparatus, a plurality of secondary batteries are connected in series and/or in parallel for use, and this is used in the form of a battery pack including a battery management system to control the overall charging/discharging operation of the secondary batteries inside.

It is very important that the power storage apparatus using the high voltage high capacity secondary batteries maintains the insulation condition. If the insulation condition of the battery is not maintained, a leakage current occurs, causing various problems. Specifically, due to a leakage current, the life of the battery may be shortened, and besides, an electric device connected to the battery may malfunction, and a safety-related accident such as an electric shock may occur.

To prevent the leakage current, monitoring of insulation resistance of the battery is required.

FIG. 1 is a schematic diagram showing the configuration of a battery and a conventional insulation resistance calculation apparatus.

Referring to FIG. 1, the battery 20 including two or more cells 21 connected to each other in series and/or in parallel is shown. Additionally, each insulation resistance $R_{Leak(+)}$, $R_{Leak(-)}$ is provided between the terminals on the two sides of the battery 20 and the ground (e.g., automotive chassis). The insulation resistance $R_{Leak(+)}$, $R_{Leak(-)}$ is said to be a virtual resistance component corresponding to the insulation condition of the battery 20. When the insulation condition of the terminals on the two sides of the battery 20 is maintained well, the resistance value of insulation resistance $R_{Leak(+)}$, $R_{Leak(-)}$ will have a sufficiently large value. On the contrary, when the battery 20 is in insulation breakdown state, the resistance value of insulation resistance $R_{Leak(+)}$, $R_{Leak(-)}$ will be very small below the permitted value.

Referring back to FIG. 1, the insulation resistance calculation apparatus 10 is connected to the positive electrode terminal and the negative electrode terminal of the battery 20. The insulation resistance calculation apparatus 10 has therein a test resistor 11 and a voltage measuring unit 12 to measure the voltage applied to the test resistor 11. The insulation resistance calculation apparatus 10 calculates first insulation resistance $R_{Leak(+)}$ and second insulation resistance $R_{Leak(-)}$ using the voltage value measured through the voltage measuring unit 12.

Stray capacitance may exist each of the terminals on the two sides of the battery 20. Similar to the insulation resistance, when the stray capacitance component is modeled as an equivalent circuit, it may be represented as two capacitors each connected in parallel to two insulation resistance $R_{Leak(+)}$, $R_{Leak(-)}$.

FIG. 2 is a schematic diagram showing an equivalent circuit of a battery pack in which the insulation resistance and stray capacitance components are represented. That is, as shown in FIG. 2, the insulation resistance $R_{Leak(+)}$ and the stray capacitance $C_{P(+)}$ may be connected in parallel between the positive electrode terminal of the battery 20 and the ground, and the insulation resistance $R_{Leak(-)}$ and the stray capacitance $C_{P(-)}$ may be connected in parallel between the negative electrode terminal of the battery 20 and the ground. As above, in the presence of stray capacitance $C_{P(+)}$, $C_{P(-)}$, the conventional insulation resistance calculation apparatus 10 is difficult to accurately measure the voltage. This is because for the voltage measuring unit 12 to measure the stabilized voltage, it is necessary to wait until the stray capacitance ($C_{P(+)}$, $C_{P(-)}$) is sufficiently discharged.

In other words, in an ideal situation in which there is no stray capacitance $C_{P(+)}$, $C_{P(-)}$, the voltage value has a constant value immediately after switching, but in the presence of stray capacitance $C_{P(+)}$, $C_{P(-)}$, the voltage reaches a stable state after a certain period of time passes.

Thus, according to the conventional art, to measure the correct voltage value, it takes a few seconds or longer which is sufficient time that the voltage applied to the test resistor 11 reaches a stable state.

SUMMARY

The present disclosure is designed to solve the problem such as the foregoing, and therefore, the present disclosure is directed to providing an apparatus and method for calculating the insulation resistance of a battery rapidly and accurately before stray capacitance connected to each of the terminals on the two sides of the battery is sufficiently discharged.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

An insulation resistance calculation apparatus according to an aspect of the present disclosure includes a switching unit including a first switch and a second switch that are independently controlled, a first protective resistor and a first reference resistor connected in series between a positive electrode terminal of a battery and a ground when the first switch is turned on, a second protective resistor and a second reference resistor connected in series between a negative electrode terminal of the battery and the ground when the second switch is turned on, a voltage measuring unit configured to measure a first detection voltage applied to the first reference resistor and a second detection voltage applied to the second reference resistor, and a processor configured to control the first switch and the second switch according to a preset rule, to record measured values of the first detection voltage and measured values of the second detection voltage, and to calculate first insulation resistance between the positive electrode terminal of the battery and the ground and second insulation resistance between the negative electrode terminal of the battery and the ground. The processor is configured to record the measured values of the first detection voltage measured sequentially at least three times by the voltage measuring unit in a first switching mode in which the first switch is turned on and the second switch is turned off, record the measured values of the second detection voltage measured sequentially at least three times by the voltage measuring unit in a second switching mode in which the first switch is turned off and the second switch is turned on, determine if a measurement error occurred in the first switching mode, based on at least two of the measured values of the first detection voltage recorded in the first switching mode, determine if a measurement error occurred in the second switching mode, based on at least two of the measured values of the second detection voltage recorded in the second switching mode, estimate a convergence value of the first detection voltage based on the measured values of the first detection voltage recorded in the first switching mode, when it is determined that a measurement error did not occur in the first switching mode, estimate a convergence value of the second detection voltage based on the measured values of the second detection voltage recorded in the second switching mode, when it is determined that a measurement error did not occur in the second switching mode, and calculate the first insulation resistance and the second insulation resistance based on the convergence value of the first detection voltage and the convergence value of the second detection voltage.

Additionally, the voltage measuring unit is configured to measure the first detection voltage sequentially at least three times every preset first time in the first switching mode, and measure the second detection voltage sequentially at least three times every preset second time in the second switching mode.

Additionally, the measured values in the first switching mode may include a first measured value, a second measured value after the first measured value, and a third measured value after the second measured value. In this case, the processor may be configured to determine that a measurement error occurred in the first switching mode, when the first measured value is equal to or lower than the second measured value or the second measured value is equal to or lower than the third measured value.

Additionally, the measured values in the second switching mode may include a fourth measured value, a fifth measured value after the fourth measured value, and a sixth measured value after the fifth measured value. In this case, the processor may be configured to determine that a measurement error occurred in the second switching mode, when the fourth measured value is equal to or lower than the fifth measured value or the fifth measured value is equal to or less than the sixth measured value.

Additionally, the measured values in the first switching mode may include a first measured value, a second measured value after the first measured value, and a third measured value after the second measured value. The processor may be configured to determine that a measurement error occurred in the first switching mode, when an absolute value of a slop of a first straight line connecting the first measured value and the second measured value is equal to or lower than an absolute value of a slop of a second straight line connecting the second measured value and the third measured value.

Additionally, the measured values in the second switching mode may include a fourth measured value, a fifth measured value the fourth measured value, and a sixth measured value after the fifth measured value. In this case, the processor may be configured to determine that a measurement error occurred in the second switching mode, when an absolute value of a slop of a third straight line connecting the fourth measured value and the fifth measured value is equal to or lower than an absolute value of a slop of a fourth straight line connecting the fifth measured value and the sixth measured value.

Additionally, the processor may configured to re-execute the first switching mode when it is determined that a measurement error occurred in the first switching mode, and re-execute the second switching mode when it is determined that a measurement error occurred in the second switching mode.

Additionally, the insulation resistance calculation apparatus may further include a direct current voltage source connected between the second reference resistor and the ground.

Additionally, the processor may be configured to measure the first detection voltage and the second detection voltage in a third switching mode in which the first switch is turned on and the second switch is turned on, and calculate the first insulation resistance and the second insulation resistance, further based on the measured value of the first detection voltage and the measured value of the second detection voltage in the third switching mode.

A method for calculating insulation resistance of a battery according to another aspect of the present disclosure uses the insulation resistance calculation apparatus. The insulation resistance calculation method includes measuring the first detection voltage sequentially at least three times in a first switching mode the first switch is turned on and the second switch is turned off, measuring the second detection voltage sequentially at least three times in a second switching mode in which the first switch is turned off and the second switch is turned on, determining if a measurement error occurred in the first switching mode, based on at least two of the measured values in the first switching mode, determining if a measurement error occurred in the second switching mode, based on at least two of the measured values in the second switching mode, estimating a convergence value of the first detection voltage based on the measured values in the first switching mode when it is determined that a measurement error did not occurred in the first switching mode, estimating a convergence value of the second detection voltage based on the measured values in the second switching mode, when it is determined that a measurement error did not occurred in the second switching mode, and calculating the first insulation resistance and the second insulation resistance based on the convergence value of the first detection voltage and the convergence value of the second detection voltage.

According to an aspect of the present disclosure, it is possible to calculate each of two insulation resistance connected to the terminals on the two sides of a battery rapidly and accurately before stray capacitance connected to the terminals on the two sides of the battery is sufficiently discharged.

The present disclosure may have other various effects, and such other effects of the present disclosure will be understood by the following description, and are apparent from the embodiments of the present disclosure.

BRIEF DESCRIPTION OF THE DRAWINGS

The accompanying drawings illustrate a preferred embodiment of the present disclosure and together with the detailed description of the present disclosure, serve to provide further understanding of the technical aspects of the present disclosure, and thus, the present disclosure is not construed as being limited to the drawings.

DETAILED DESCRIPTION

Figure 1:
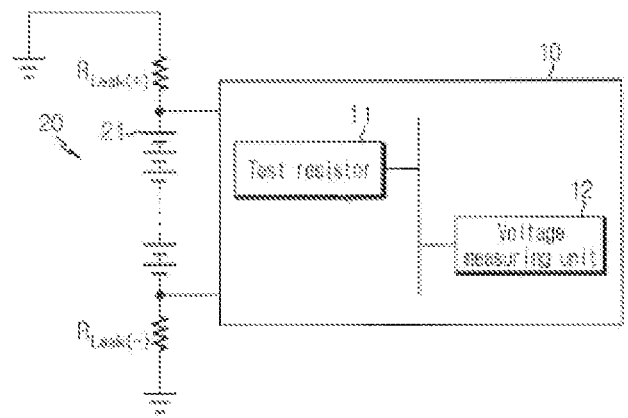
FIG. 1 is a schematic diagram showing the configuration of a battery and a conventional insulation resistance calculation apparatus.
Figure 2:
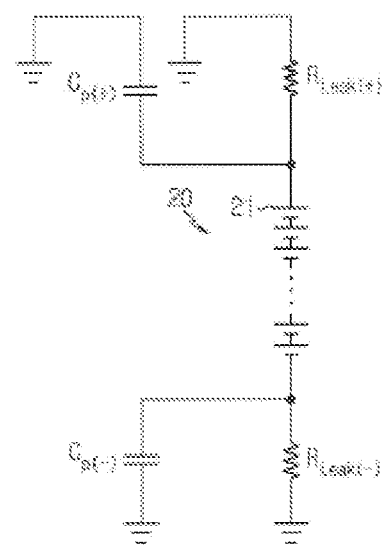
FIG. 2 is a schematic diagram showing an equivalent circuit of a battery pack in which insulation resistance and stray capacitance components are represented.

Hereinafter, preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, not intended to fully described the present disclosure, so it should be understood that other equivalents and modifications could be made thereto at the time of filing the application.

Additionally, in describing the present disclosure, when it is deemed that a detailed description of known elements or functions renders the key subject matter of the present disclosure ambiguous, its detailed description is omitted herein.

Figure 3:
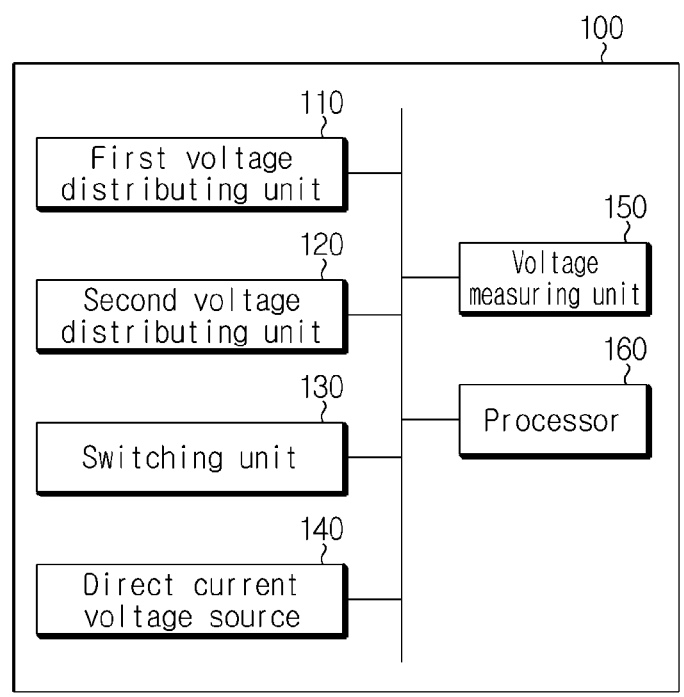
FIG. 3 is a schematic diagram showing the functional configuration of an insulation resistance calculation apparatus according to an embodiment of the present disclosure.
Figure 4:
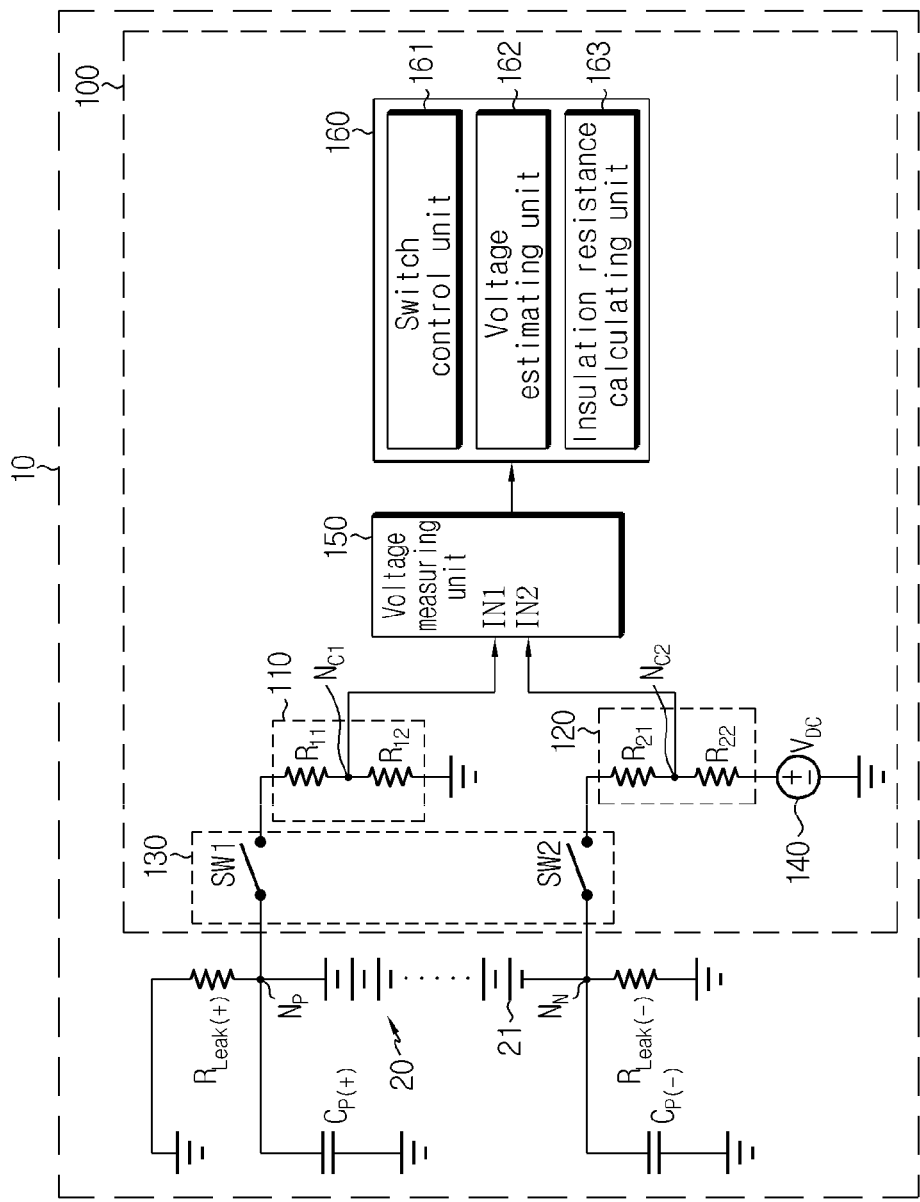
FIG. 4 is a schematic diagram showing the circuit configuration of a battery pack according to an embodiment of the present disclosure.

FIG. 3 is a schematic diagram showing the functional configuration of an insulation resistance calculation apparatus according to an embodiment of the present disclosure, and FIG. 4 is a schematic diagram showing the circuit configuration of a battery pack 10 according to an embodiment of the present disclosure.

Referring to FIGS. 3 and 4, the insulation resistance calculation apparatus 100 is connected to a positive electrode terminal $N_P$ and a negative electrode terminal $N_N$ of a battery 20 provided in the battery pack 10.

Here, the battery 20 refers to a single battery cell 21 or an assembly of battery cells 21, and the assembly of battery cells may include battery cells 21 connected either in series or in parallel, or both.

The battery cell 21 may be an electric double layer capacitor including an ultra capacitor or a secondary battery such as a lithium ion battery, a lithium polymer battery, a nickel cadmium battery, a nickel hydrogen battery and a nickel zinc battery.

Meanwhile, the positive electrode terminal $N_P$ and the negative electrode terminal $N_N$ of the battery 20 are connected to insulation resistance $R_{Leak(+)}$, $R_{Leak(-)}$. Specifically, first insulation resistance $R_{Leak(+)}$ is connected between the positive electrode terminal $N_P$ of the battery 20 and the ground, and second insulation resistance $R_{Leak(-)}$ is connected between the negative electrode terminal $N_N$ of the battery 20 and the ground.

The insulation resistance $R_{Leak(+)}$, $R_{Leak(-)}$ is said to be an equivalent resistance for representing the insulation condition of the battery pack 10. When the insulation condition of the battery pack 10 is maintained well, the resistance values of the first and second insulation resistance $R_{Leak(+)}$, $R_{Leak(-)}$ will have a sufficiently large value, and on the contrary, when the battery pack 10 is in insulation breakdown state, at least one resistance value of the first and second insulation resistance $R_{Leak(+)}$, $R_{Leak(-)}$ will have a very small value below a critical value.

Additionally, stray capacitance $C_{P(+)}$, $C_{P(-)}$ is connected to the positive electrode terminal $N_P$ and the negative electrode terminal $N_N$ of the battery 20. Specifically, the positive electrode side stray capacitance $C_{P(+)}$ is connected between the positive electrode terminal $N_P$ of the battery 20 and the ground, and the negative electrode side stray capacitance $C_{P(-)}$ is connected between the negative electrode terminal $N_N$ of the battery 20 and the ground. Similar to the insulation resistance $R_{Leak(+)}$, $R_{Leak(-)}$, the stray capacitance $C_{P(+)}$, $C_{P(-)}$ is said to be an equivalent capacitance representing the capacitor component. The stray capacitance $C_{P(+)}$, $C_{P(-)}$ may be each equalized in the form of connection in parallel to insulation resistance $R_{Leak(+)}$, $R_{Leak(-)}$ as shown in FIG. 4.

Referring back to FIGS. 3 and 4, the insulation resistance calculation apparatus 100 includes a first protective resistor R11, a second protective resistor R21, a first reference resistor R12, a second reference resistor R22, a switching unit 130, a voltage measuring unit 150, and a processor 160. The first protective resistor R11 and the first reference resistor R12 are interconnect via a first common node $N_{C1}$, and is referred to as a first voltage dividing unit 110. The second protective resistor R21 and the second reference resistor R22 are interconnected via a second common node $N_{C2}$, and is referred to as a second voltage dividing unit 120.

According to an embodiment, the insulation resistance calculation apparatus 100 may further include a direct current voltage source 140 connected between the second reference resistor R22 and the ground. As the second reference resistor R22 is connected between the negative electrode terminal $N_N$ of the battery 20 and the ground, the voltage applied between the second common node $N_{C2}$ and the ground may have a negative value. Accordingly, the direct current voltage source 140 may be provided for the voltage applied between the second common node $N_{C2}$ and the ground to have a positive value. In this instance, the voltage value $V_{DC}$ outputted from the direct current voltage source 140 may be set such that the voltage applied between the second common node $N_{C2}$ and the ground has a positive value (i.e., the second detection voltage is equal to or larger than 0V), and pre-stored in the processor 160.

Optionally, the insulation resistance calculation apparatus 100 may further include an information presentation unit. The information presentation unit may include at least one of a light emitting diode (LED), a display and a speaker to output information associated with the insulation condition of the battery 20 in the form of a signal recognizable by a user.

The processor 160 may include a switch control unit 161, a voltage estimating unit 162, and an insulation resistance calculating unit 163. Additionally, the processor 160 may be implemented such that it includes the voltage measuring unit 150 as well.

The switching unit 130 may include a first switch SW1 and a second switch SW2. The first switch SW1 may be connected between the positive electrode terminal $N_P$ and the first voltage dividing unit 110. The second switch SW2 may be connected between the positive electrode terminal $N_N$ and the second voltage dividing unit 120. The first switch SW1 and the second switch SW2 may be independently controlled in response to the signal from the switch control unit 161. That is, as the first switch SW1 and the second switch SW2 are each turned on or off, the first switch SW1 and the second switch SW2 may operate according to a maximum of four switching modes. The four switching modes include a first switching mode in which the first switch SW1 and the second switch SW2 are 'turned on-turned off', a second switching mode in which the first switch SW1 and the second switch SW2 are 'turned off-turned on', a third switching mode in which the first switch SW1 and the second switch SW2 are 'turned on-turned on', and a fourth switching mode in which the first switch SW1 and the second switch SW2 are 'turned off-turned off'. Accordingly, different circuits may be formed in the battery pack 10 by each switching mode.

When the first switch SW1 is turned on, the first protective resistor R11 and the first reference resistor R12 may be connected in series between the positive electrode terminal $N_P$ of the battery 20 and the ground. When the first switch SW1 is turned off, the first protective resistor R11 and the first reference resistor R12 may be electrically separated from the positive electrode terminal $N_P$ of the battery 20.

Specifically, one end of the first protective resistor R11 and one end of the first reference resistor R12 are connected through the first common node $N_{C1}$. Additionally, the other end of the first protective resistor R11 is connected to or separated from the positive electrode terminal $N_P$ through the first switch SW1. Additionally, the other end of the first reference resistor R12 is connected to the ground.

When the second switch SW2 is turned on, the second protective resistor R21 and the second reference resistor R22 may be connected in series between the negative electrode terminal $N_N$ of the battery 20 and the ground. When the second switch SW2 is turned off, the second protective resistor R21 and the second reference resistor R22 may be electrically separated from the negative electrode terminal $N_N$ of the battery 20.

Specifically, one end of the second protective resistor R21 and one end of the second reference resistor R22 are connected through the second common node $N_{C2}$. Additionally, the other end of the second protective resistor R21 is connected to or separated from the negative electrode terminal $N_N$ through the second switch SW2. Additionally, the other end of the second reference resistor R22 is connected to the ground.

Each resistance value of the first protective resistor R11, the first reference resistor R12, the second protective resistor R21 and the second reference resistor R22 may be pre-stored in the processor 160. Preferably, a ratio between the resistance value of the first protective resistor R11 and the resistance value of the first reference resistor R12 may be the same as the ratio between the resistance value of the second protective resistor R21 and the resistance value of the second reference resistor R22. For example, the resistance value of the first protective resistor R11 may be equal to the resistance value of the second protective resistor R21, and the resistance value of the first reference resistor R12 may be equal to the resistance value of the second reference resistor R22.

The voltage applied to the first voltage dividing unit 110 may be divided based on the ratio between the resistance value of the first protective resistor R11 and the resistance value of the first reference resistor R12, and measured by the voltage measuring unit 150. Similarly, the voltage applied to the second voltage dividing unit 120 may be divided based on the ratio between the resistance value of the second protective resistor R12 and the resistance value of the second reference resistor R22, and measured by the voltage measuring unit 150.

The switch control unit 161 may independently control the first switch SW1 and the second switch SW2 according to a preset rule. That is, the switch control unit 161 may selectively turn on or off the first switch SW1 and the second switch SW2. The switch control unit 161 may form different circuits in the battery pack 10 by controlling the first switch SW1 and the second switch SW2.

More specifically, the switch control unit 161 may form various circuits as below by controlling the first switch SW1 and the second switch SW2.

The switch control unit 161 turns on the first switch SW1 and turns off the second switch SW2 in the first switching mode to form a first circuit CC1. The first circuit CC1 refers to a circuit in which the first voltage dividing unit 110 is connected to the positive electrode terminal $N_P$, and the second voltage dividing unit 120 is separated from the negative electrode terminal $N_N$.

Additionally, the switch control unit 161 turns off the first switch SW1 and turns on the second switch SW2 in the second switching mode to form a second circuit CC2. The second circuit CC2 refers to a circuit in which the first voltage dividing unit 110 is separated from the positive electrode terminal $N_P$, and the second voltage dividing unit 120 is connected to the negative electrode terminal $N_N$.

Additionally, the switch control unit 161 turns on the first switch SW1 and the second switch SW2 in the third switching mode to form a third circuit. The third circuit refers to a circuit in which the first voltage dividing unit 110 is connected to the positive electrode terminal $N_P$, and the second voltage dividing unit 120 is connected to the negative electrode terminal $N_N$.

Additionally, the switch control unit 161 turns off the first switch SW1 and the second switch SW2 in the fourth switching mode to form a fourth circuit. The fourth circuit refers to a circuit in which the first reference resistor R12 is not connected to the positive electrode terminal $N_P$ and the second reference resistor R22 is not connected to the negative electrode terminal $N_N$.

The voltage measuring unit 150 may measure the voltage (hereinafter referred to as 'first detection voltage') applied to the first common node $N_{C1}$ and the voltage (hereinafter referred to as 'second detection voltage') applied to the second common node $N_{C2}$.

To this end, the voltage measuring unit 150 may include a first input port IN1 connected to the first common node $N_{C1}$ and a second input port IN2 connected to the second common node $N_{C2}$. The voltage measuring unit 150 may include an Analog-Digital Converter (ADC) as a voltage sensor, and the ADC may convert an analog signal corresponding to the potential formed at the first input port IN1 to a digital signal, and an analog signal corresponding to the potential formed at the second input port IN2 to a digital signal.

The voltage measuring unit 150 may measure the first detection voltage sequentially at least three times every preset first time in the first switching mode, and measure the second detection voltage sequentially at least three times every preset second time in the second switching mode. In this instance, any one of the first time and the second time may be identical to or different from the other. Additionally, the voltage measuring unit 150 may measure each of the first detection voltage and the second detection voltage at least once in the third switching mode.

The voltage measuring unit 150 may transmit the measured values in the first switching mode, the measured values in the second switching mode, and the measured value in the third switching mode to the voltage estimating unit 162.

The voltage estimating unit 162 may calculate the voltage $V_{Bat}$ of the battery 20 based on the measured value of the first detection voltage and the measured value of the second detection voltage in the third switching mode transmitted from the voltage measuring unit 150.

Additionally, the voltage estimating unit 162 may estimate a convergence value of each of the first detection voltage in the first switching mode and the second detection voltage in the second switching mode based on the measured values associated with the first switching mode and the second switching mode transmitted from the voltage measuring unit 150.

As described above, in the first switching mode, it takes a considerable amount of time to stabilize the first detection voltage (i.e., the voltage change ratio is equal to or larger than the critical value) due to the stray capacitance $C_{P(+)}$, and the voltage estimating unit 162 may pre-estimate the first convergence value that is a voltage value where the first detection voltage will finally reach, based on the measured values of the first detection voltage, before the first detection voltage is actually stabilized.

Likewise, in the second switching mode, it takes a considerable amount of time to stabilize the second detection voltage due to the stray capacitance $C_{P(-)}$, and the voltage estimating unit 162 may pre-estimate the second convergence value that is a voltage value where the second detection voltage will finally reach, based on the measured values of the second detection voltage, before the second detection voltage is actually stabilized.

Specifically, while the first circuit CC1 is formed, the voltage estimating unit 162 may record the measured values of the first detection voltage measured sequentially at least three times by the voltage measuring unit 150, and estimate the first convergence value of the first detection voltage based on the recorded measured values of the first detection voltage.

Aside from this, while the second circuit CC2 is formed, the voltage estimating unit 162 may record the measured values of the second detection voltage measured sequentially at least three times by the voltage measuring unit 150, and estimate the second convergence value of the second detection voltage based on the recorded measured values of the second detection voltage.

The voltage estimating unit 162 may use the following Equation 1 to estimate each of the first convergence value and the second convergence value.

$$y_f = \frac{y_2^2 - y_1 * y_3}{2 * y_2 - y_1 - y_3} \quad \text{[Equation 1]}$$

In Equation 1, when three measured values obtained by sequentially measuring the first detection voltage every preset first time in the first switching mode are substituted for $y_1$, $y_2$ and $y_3$, $y_f$ is the first convergence value.

In Equation 1, when three measured values obtained by sequentially measuring the second detection voltage every preset second time in the second switching mode are substituted for $y_1$, $y_2$ and $y_3$, $y_f$ is the second convergence value.

Equation 1 may be derived through the following Equations 2 to 9.

When the resistance values of the resistors R11, R12, $R_{Leak(+)}$, $R_{Leak(-)}$ of the first circuit CC1 formed in the first switching mode and the capacitance of the capacitor $C_{P(+)}$, $C_{P(-)}$ are equalized, the first circuit CC1 is a first-order circuit. Likewise, when the resistance values of the resistors R21, R22, $R_{Leak(+)}$, $R_{Leak(-)}$ of the second circuit CC2 formed in the second switching mode and the capacitance of the capacitor $C_{P(+)}$, $C_{P(-)}$ are equalized, the second circuit CC2 is also a first-order circuit that is different from the first circuit CC1.

Accordingly, the first detection voltage while the first circuit CC1 is formed and the second detection voltage while the second circuit CC2 is formed may be represented in the form of complete response of an arbitrary first-order circuit such as Equation 2 below.

$$v(t) = y_f + (y_i - y_f) * e^{\frac{-t}{RC}} \quad \text{[Equation 2]}$$

In Equation 2, t is the elapsed time since the first-order circuit is formed, RC is the time constant of the first-order circuit, $y_f$ is the convergence value corresponding to the forced response of the first-order circuit, $y_i$ is the initial value immediately after first-order circuit is formed, and v(t) is the complete response over t.

Subtracting $y_f$ from both sides of Equation 2, then Equation 2 may be expressed as the following Equation 3.

$$v(t) - y_f = (y_i - y_f) * e^{\frac{-t}{RC}} \quad [\text{Equation 3}]$$

When t1<t2<t3, v(t1)=$y_1$, v(t2)=$y_2$, v(t2)=$y_3$, and each of t1, t2, t3 is substituted for t of Equation 3, the following three Equations are given.

$$y_1 - y_f = (y_i - y_f) * e^{\frac{-t1}{RC}} \quad [\text{Equation 4}]$$

$$y_2 - y_f = (y_i - y_f) * e^{\frac{-t2}{RC}} \quad [\text{Equation 5}]$$

$$y_3 - y_f = (y_i - y_f) * e^{\frac{-t3}{RC}} \quad [\text{Equation 6}]$$

When Equation 4 is divided by Equation 5, the following Equation 7 is given, and when Equation 5 is divided by Equation 6, the following Equation 8 is given.

$$\frac{y_1 - y_f}{y_2 - y_f} = \frac{(y_i - y_f) * e^{\frac{-t1}{RC}}}{(y_i - y_f) * e^{\frac{-t2}{RC}}} = e^{\frac{t2-t1}{RC}} \quad [\text{Equation 7}]$$

$$\frac{y_2 - y_f}{y_3 - y_f} = \frac{(y_i - y_f) * e^{\frac{-t2}{RC}}}{(y_i - y_f) * e^{\frac{-t3}{RC}}} = e^{\frac{t3-t2}{RC}} \quad [\text{Equation 8}]$$

In Equation 7 and Equation 8, when t2−t1=t3−t2, the following Equation 9 is given.

$$\frac{y_1 - y_f}{y_2 - y_f} = \frac{y_2 - y_f}{y_3 - y_f} \quad [\text{Equation 9}]$$

When Equation 9 is written with respect to $y_f$, the above Equation 1 is given. That is, in Equation 2 representing the complete response of the first-order circuit, only $y_f$, $y_i$ and RC are unknown, so if three different measured values that will be substituted for each of $y_1$, $y_2$ and $y_3$ are determined, $y_f$, $y_i$ and RC for the complete response of the first-order circuit may be obtained.

When the estimation of the first convergence value and the second convergence value by the voltage estimating unit 162 is completed, the insulation resistance calculating unit 163 may calculate each of the first insulation resistance $R_{Leak(+)}$ and the second insulation resistance $R_{Leak(-)}$ based on the estimated first convergence value and second convergence value.

Hereinafter, the operation for estimating the first convergence value and the second convergence value will be described in detail with reference to FIGS. 5 to 8.

Figure 5:
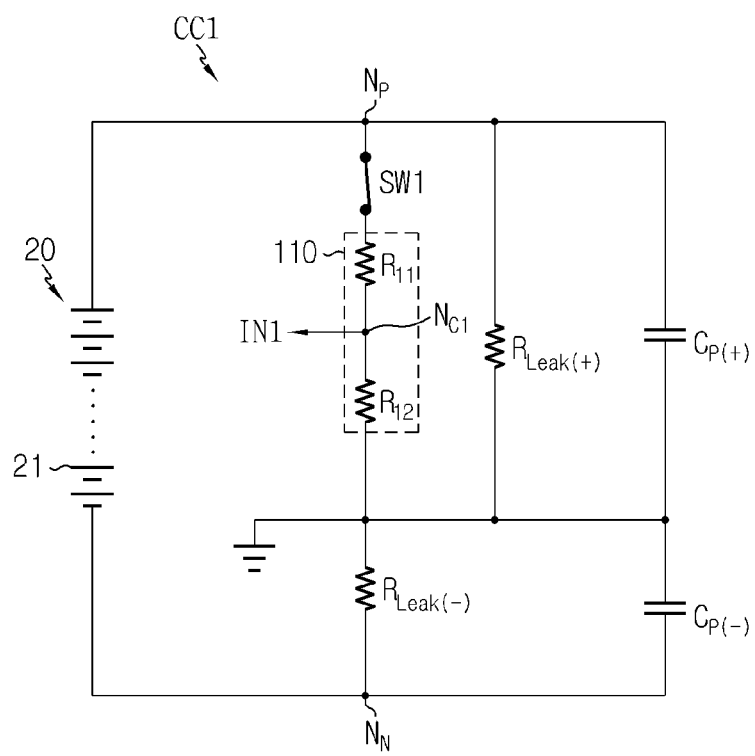
FIG. 5 is a reference diagram illustrating a first circuit formed in a battery pack while an insulation resistance calculation apparatus according to an embodiment of the present disclosure is in first switching mode.
Figure 6:
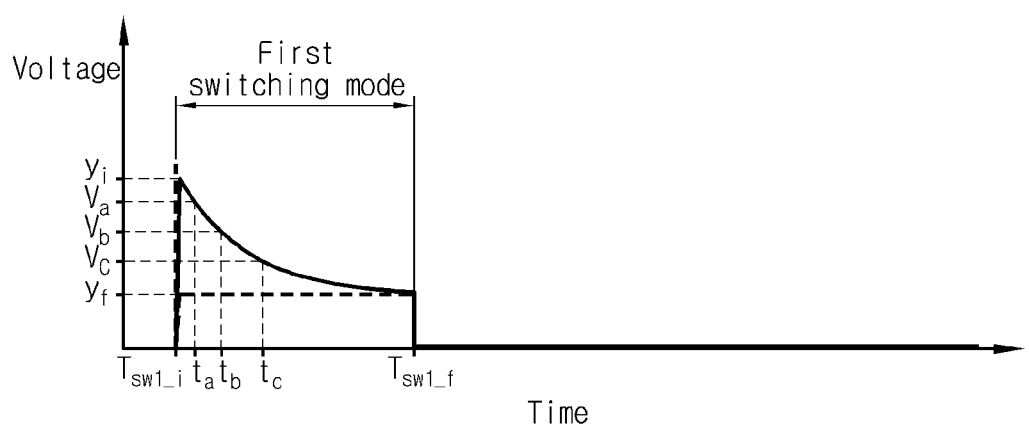
FIG. 6 is a reference diagram illustrating the changes in first detection voltage while the first circuit shown in FIG. 5 is formed.

FIG. 5 is a reference diagram illustrating the first circuit CC1 formed in the battery pack 10 while the insulation resistance calculation apparatus according to an embodiment of the present disclosure is in the first switching mode, and FIG. 6 is a reference diagram illustrating the changes in the first detection voltage while the first circuit the first circuit CC1 shown in FIG. 5 is formed.

Referring to FIGS. 5 and 6, when the first switch is turned on and the second switch is turned off in the first switching mode, the first circuit CC1 is formed in the battery pack 10. In the graph shown in FIG. 6, a solid line is a profile in the presence of stray capacitance $C_{P(+)}$, $C_{P(-)}$, and a dotted line is a profile in the absence of stray capacitance $C_{P(+)}$, $C_{P(-)}$.

While the first circuit CC1 is formed, the voltage measuring unit 150 measures the first detection voltage sequentially at least three times, and transmits the measured values to the voltage estimating unit 162. While the first circuit CC1 is formed, the voltage measuring unit 150 defers measuring the second detection voltage.

Assume that the first switching mode is maintained from $T_{SW1\_i}$ to $T_{SW1\_f}$. In this instance, $T_{SW1\_i}$ is the point in time when the insulation resistance calculation apparatus entered the first switching mode, and is the same as the point in time when the first circuit CC1 is formed. Additionally, $T_{SW1\_f}$ is the point in time when the first detection voltage actually reaches a stable state, and may vary depending on how much stray capacitance $C_{P(+)}$, $C_{P(-)}$ is charged. Additionally, in the graph shown in FIG. 6, the region before $T_{SW1\_i}$ and after $T_{SW1\_f}$ represents the first detection voltage when the first switch is turned off.

The voltage measuring unit 150 may measure the first detection voltage sequentially at least three times every first time after $T_{SW1\_i}$. For example, the voltage measuring unit 150 may measure the first detection voltage at ta, tb and tc, and transmit the measured values Va, Vb, Vc to the voltage estimating unit 162. In this instance, the first time=tb−ta=tc−tb. Accordingly, the voltage estimating unit 162 may record the measured value Va at ta, the measured value Vb at tb, and the measured value Vc at tc.

The voltage estimating unit 162 may estimate the first convergence value before $T_{SW1\_f}$ by substituting the recorded measured values Va, Vb, Vc for $y_1$, $y_2$ and $y_3$ of the above Equation 1 respectively. For example, when Va=5V, Vb=2V, Vc=1V, the first convergence value=$y_f$=(4−5)/(4−6) =0.5V by Equation 1.

Figure 7:
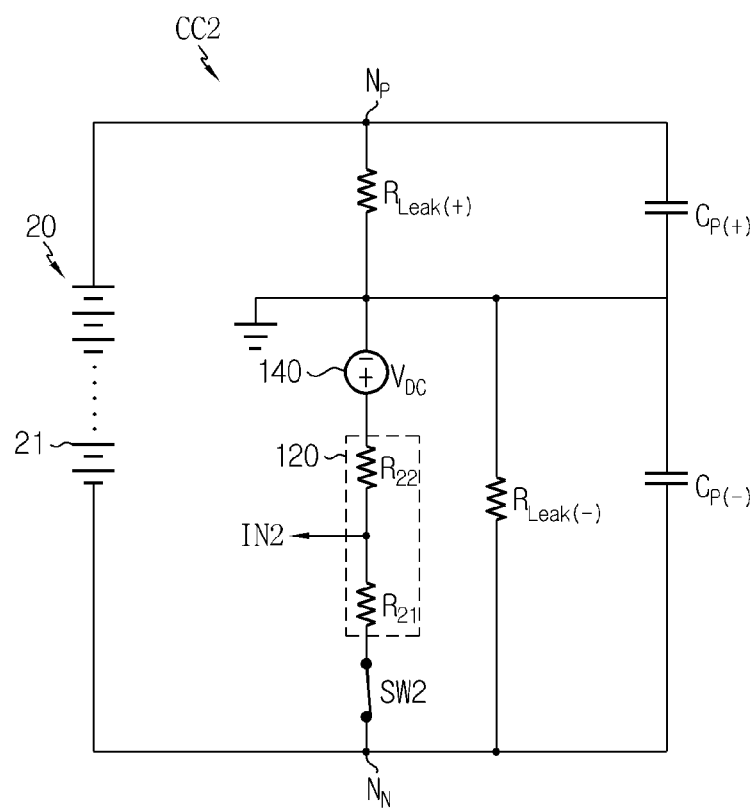
FIG. 7 is a reference diagram illustrating a second circuit formed in a battery pack while an insulation resistance calculation apparatus according to an embodiment of the present disclosure is in second switching mode.
Figure 8:
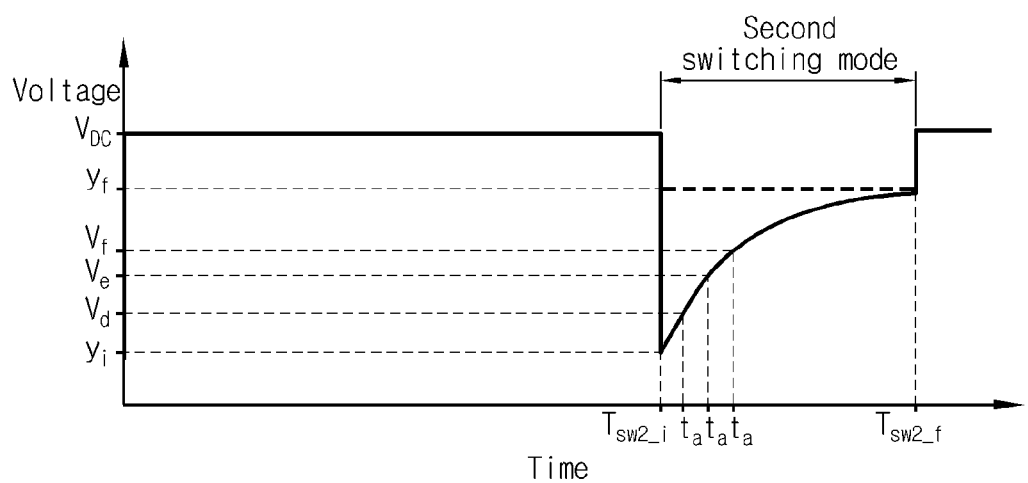
FIG. 8 is a reference diagram illustrating the changes in second detection voltage while the second circuit shown in FIG. 7 is formed.

FIG. 7 is a reference diagram illustrating the second circuit CC2 formed in the battery pack 10 while the insulation resistance calculation apparatus according to an embodiment of the present disclosure is in the second switching mode, and FIG. 8 is a reference diagram illustrating the changes in the second detection voltage while the second circuit CC2 shown in FIG. 7 is formed.

Referring to FIGS. 7 and 8, when the first switch is turned off and the second switch is turned on in the second switching mode, the second circuit CC2 is formed in the battery pack 10. In the graph shown in FIG. 8, a solid line is a profile in the presence of stray capacitance $C_{P(+)}$, $C_{P(-)}$, and a dotted line is a profile in the absence of stray capacitance $C_{P(+)}$, $C_{P(-)}$.

While the second circuit CC2 is formed, the voltage measuring unit 150 measures the second detection voltage sequentially at least three times, and transmits the measured values to the voltage estimating unit 162. While the second circuit CC2 is formed, the voltage measuring unit 150 defers measuring the first detection voltage.

Assume that the second switching mode is maintained from $T_{SW2\_i}$ to $T_{SW2\_f}$. In this instance, $T_{SW2\_i}$ is the point in time when the insulation resistance calculation apparatus entered the second switching mode, and is the same as the point in time when the second circuit CC2 is formed. Additionally, $T_{SW2\_f}$ is the point in time when the second detection voltage actually reaches a stable state, and may vary depending on how much stray capacitance $C_{P(+)}$, $C_{P(-)}$ is charged. Additionally, in the graph shown in FIG. 8, the region before $T_{SW2\_i}$ and after $T_{SW2\_f}$ represents the second detection voltage when the second switch is turned off.

The voltage measuring unit 150 may measure the second detection voltage sequentially at least three times every second time after $T_{SW2\_i}$. For example, the voltage measuring unit 150 may measure the second detection voltage at td, te and tf, and transmit the measured values Vd, Ve, Vf to the voltage estimating unit 162. In this instance, the second time=te−td=tf−te. Accordingly, the voltage estimating unit 162 may record the measured value Vd at td, the measured value Ve at te, and the measured value Vf at tf.

The voltage estimating unit 162 may estimate the second convergence value before $T_{SW2\_f}$ by substituting the recorded measured values for $y_1$, $y_2$ and $y_3$ of the above Equation 1 respectively. For example, when Vd=6V, Ve=9V, Vf=10V, the second convergence value=$y_f$=(81−60)/(18−16)=10.5V by Equation 1.

Meanwhile, due to a measurement error of the voltage measuring unit 150, the first detection voltage and/or the second detection voltage measured by the voltage measuring unit 150 may be different from the real one. When the first convergence value and/or the second convergence value is estimated based on the measured values different from the real one, largely two problems may occur. The first problem is that insulation breakdown occurred in the battery pack 10, but it is wrongly determined that insulation breakdown did not occur. The second problem is that the battery pack 10 is not in insulation breakdown state, but it is wrongly determined that insulation breakdown occurred in the battery pack 10.

Accordingly, before calculating the insulation resistance $R_{Leak(+)}$, $R_{Leak(-)}$ based on the first convergence value and the second convergence value, it is necessary to determine if there is a measurement error during measurements in each of the first switching mode and the second switching mode.

Figure 9:
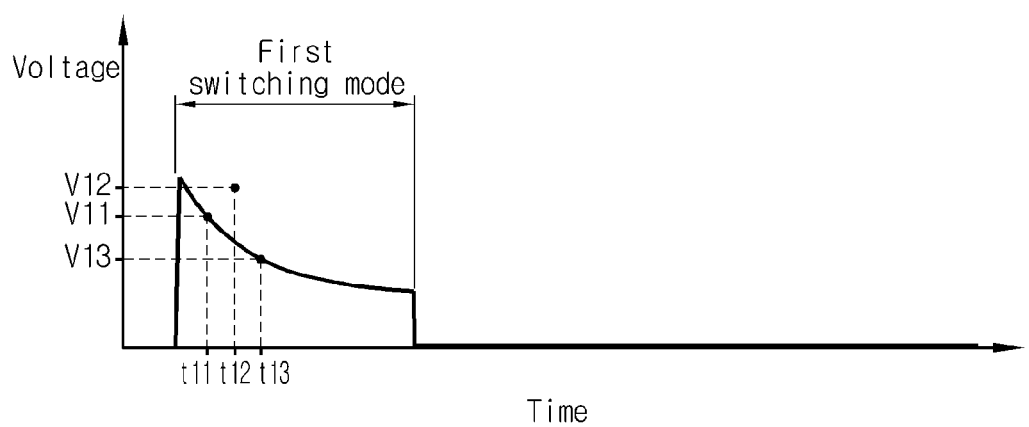
FIGS. 9 and 10 are reference diagrams illustrating an operation for determining if a measurement error occurred in the measured values in first switching mode by an insulation resistance calculation apparatus according to an embodiment of the present disclosure.
Figure 10:
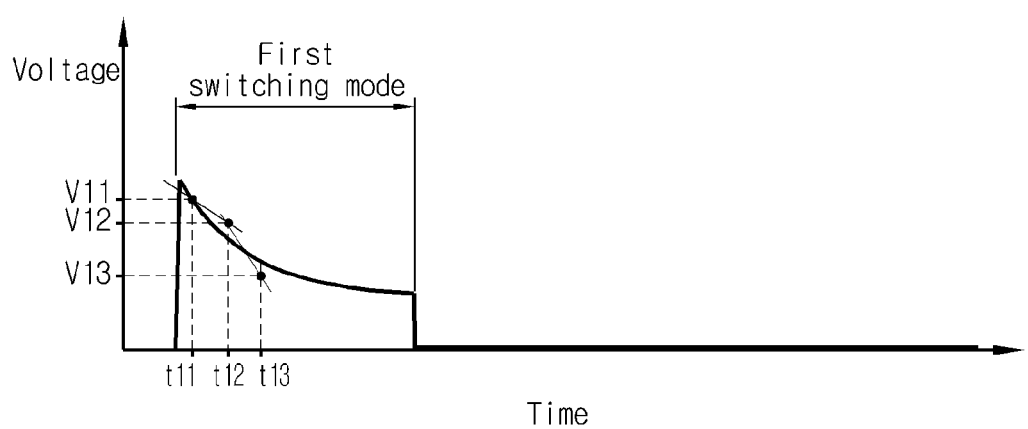

FIGS. 9 and 10 are reference diagrams illustrating an operation for determining if a measurement error occurred in the measured values in the first switching mode by the insulation resistance calculation apparatus according to an embodiment of the present disclosure. Assume Δt1=t12−t11=t13−t12.

The criterion for determining if a measurement error occurred in the first switching mode may be preset in consideration of the variable characteristics of the complete response of the first-order circuit.

Specifically, as can be seen from Equation 2, the complete response of the first-order circuit is prone to exponentially increase or reduce.

Accordingly, determination if a measurement error occurred in the first switching mode may be made by checking at least one of the following first and second conditions.

<First Condition>
Among three or more measured values, any one measured value be larger than a measured value measured later.
<Second Condition>
Among three or more measured values, an absolute value of a slope of a straight line connecting two earlier measured values be larger than an absolute value of a slope of a straight line connecting two later measured value.

When at least one of the first condition and the second condition is not satisfied, the voltage estimating unit 162 determines that a measurement error occurred in the first switching mode. Preferably, the voltage estimating unit 162 may check one of the first condition and the second condition earlier, and when the earlier checked condition is satisfied, may check if the remaining condition is satisfied.

Referring to FIG. 9, to determine if the first condition is satisfied, the voltage estimating unit 162 may check a size relationship of at least two of the measured values V11, V12, V13 measured at t11, t12 and t13 in a sequential order by the voltage measuring unit 150 during the first switching mode. That is, the voltage estimating unit 162 may check a size relationship of V11 and V12 and/or a size relationship of V12 and V13.

For example, in FIG. 9, because the measured value V12 at t12 in which the measurement error occurred is equal to or higher than the measured value V11 at t11 that is earlier than t12, the voltage estimating unit 162 may determine that the first condition is not satisfied. In this case, the voltage estimating unit 162 may determine that a measurement error occurred in at least one of the measured values V11, V12, V13 in the first switching mode without the need to check if the second condition is satisfied.

Referring to FIG. 10, the voltage estimating unit 162 calculates at least two slopes of straight lines to determine if the second condition is satisfied. Specifically, the voltage estimating unit 162 may calculate each of a slope of a first straight line=(V12−V11)/first time connecting the measured value V11 measured at t11 and the measured value V12 measured at t12 that is later than t11, and a slope of a second straight line=(V13−V12)/first time connecting the measured value V12 and the measured value V13 measured at t13.

The slope of the First straight line=(V12−V11)/Δt1
The slope of the Second straight line=(V13−V12)/Δt1

For example, as shown in FIG. 10, when the absolute value of the slope of the second straight line is equal to or higher than the absolute value of the slope of the first straight line due to an error occurred in the measured value V12 at t12 and the measured value V13 at t13, the voltage estimating unit 162 may determine that the second condition is not satisfied.

When at least one of the first condition and the second condition is not satisfied, the voltage estimating unit 162 may re-execute the first switching mode until the first condition and the second condition are all satisfied.

Figure 11:
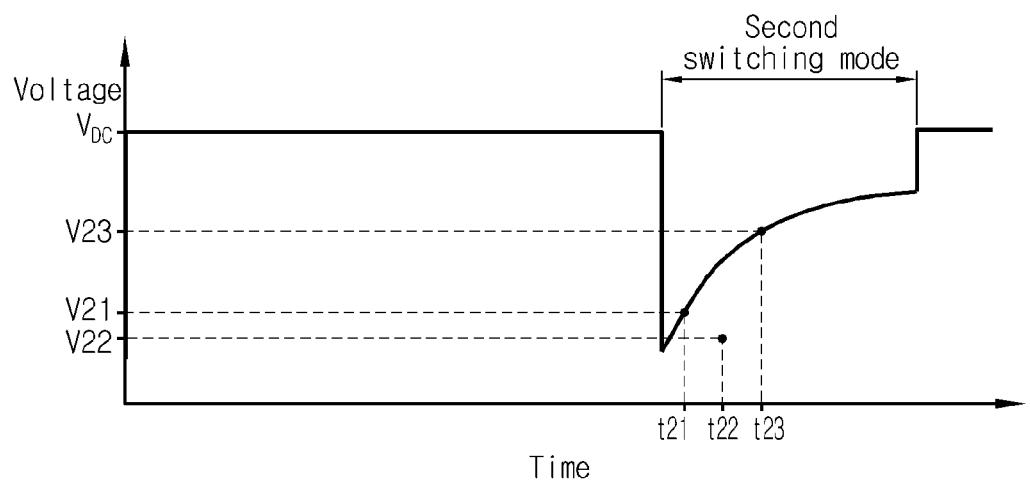
FIGS. 11 and 12 are reference diagrams illustrating an operation for determining if a measurement error occurred in the measured values in second switching mode by an insulation resistance calculation apparatus according to an embodiment of the present disclosure.
Figure 12:
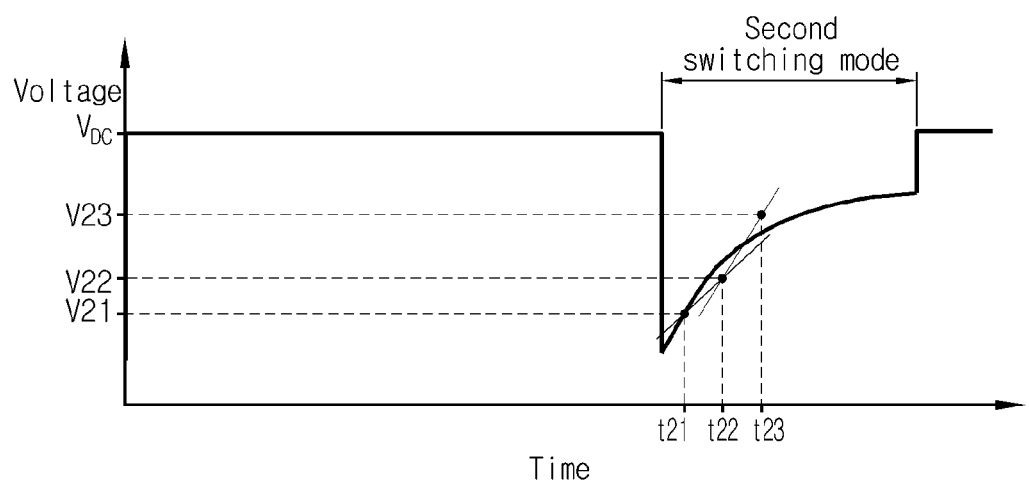

FIGS. 11 and 12 are reference diagrams illustrating an operation for determining if a measurement error occurred in the measured values in the second switching mode by the insulation resistance calculation apparatus according to an embodiment of the present disclosure. Assume Δt2=t22−t21=t23−t22.

The criterion for determining if a measurement error occurred in the second switching mode may be preset in consideration of the variable characteristics of the complete response of the first-order circuit, similar to the description made above with reference to FIGS. 9 and 10.

Determination if a measurement error occurred in the second switching mode may be made by checking at least one of the following third and fourth conditions.

<Third Condition>
Among three or more measured values, any one measured value be smaller than a measured value measured later.
<Fourth Condition>
Among three or more measured values, an absolute value of a slope of a straight line connecting two earlier measured values be larger than an absolute value of a slope of a straight line connecting two later measured value.

When at least one of the third condition and the fourth condition is not satisfied, the voltage estimating unit 162 determines that a measurement error occurred in the second switching mode. Preferably, the voltage estimating unit 162 may check one of the third condition and the fourth condition earlier, and when the earlier checked condition is satisfied, may check if the remaining condition is satisfied.

Referring to FIG. 11, to determine if the third condition is satisfied, the voltage estimating unit 162 may check a size relationship at least two of the measured values V21, V22, V23 measured at t21, t22 and t23 in a sequential order by the voltage measuring unit 150 in the second switching mode. That is, the voltage estimating unit 162 may check a size relationship of V21 and V22 and/or a size relationship of V22 and V23.

For example, in FIG. 11, because the measured value V22 measured at t12 is equal to or lower than the measured value V21 measured at t11 that is earlier than t12, the voltage estimating unit 162 may determine that the third condition is not satisfied. In this case, the voltage estimating unit 162 may determine that a measurement error occurred in at least one of the measured values V21, V22, V23 in the second switching mode without the need to check if the fourth condition is satisfied.

Referring to FIG. 12, to determine if the fourth condition is satisfied, the voltage estimating unit 162 calculates at least two slopes of straight lines. Specifically, the voltage estimating unit 162 may calculate each of a slope of a third straight line connecting the measured value V21 measured earliest and the measured value V22 measured later, and a slope of a fourth straight line connecting the measured value V22 and the measured value V23 measured latest.

The slope of the Third straight line=(V22−V21)/Δt2

The slope of the Fourth straight line=(V23−V22)/Δt2

For example, as shown in FIG. 12, when the absolute value of the slope of the fourth straight line is equal to or higher than the absolute value of the slope of the third straight line due to an error occurred in the measured value V12 at t22 and the measured value V13 at t23, the voltage estimating unit 162 may determine that the fourth condition is not satisfied.

When at least one of the third condition and the fourth condition is not satisfied, the voltage estimating unit 162 may re-execute the second switching mode until the third condition and the fourth condition are all satisfied.

Optionally, when the first to fourth conditions are all satisfied, the processor 160 may reduce the first time set latest by a predetermined value. Similarly, when the first to fourth conditions are all satisfied, the processor 160 may reduce the second time set latest by a predetermined value. That is, when the first to fourth conditions are all satisfied, the processor 160 may reduce the measurement time interval Δt1 for the first detection voltage in the first switching mode, and the measurement time interval Δt2 for the second detection voltage in the second switching mode, together or separately.

Figure 13:
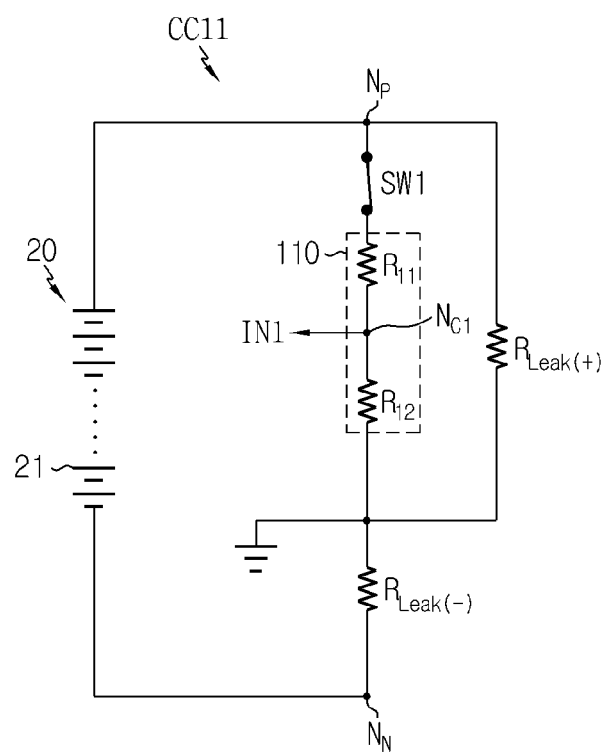
FIGS. 13 and 14 are reference diagrams illustrating an operation for calculating first insulation resistance and second insulation resistance based on a first convergence value and a second convergence value by an insulation resistance calculation apparatus according to an embodiment of the present disclosure.
Figure 14:
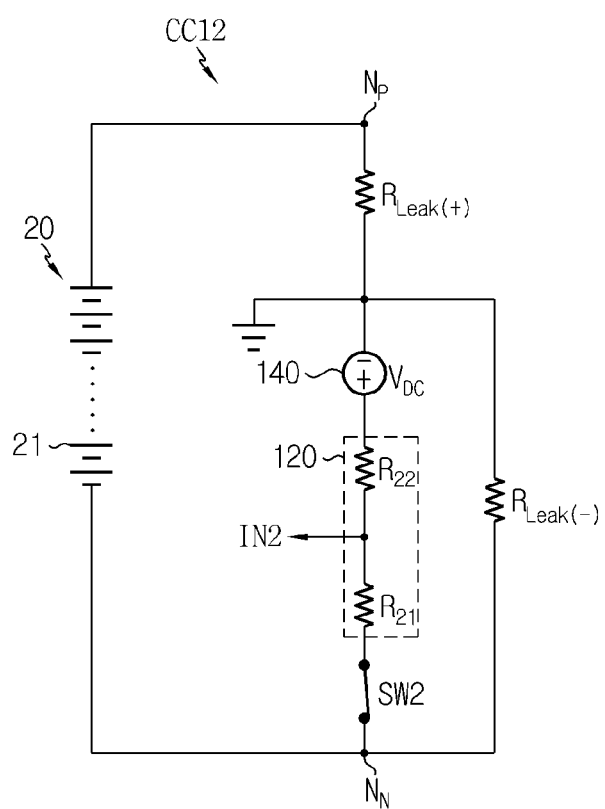

FIGS. 13 and 14 are reference diagrams illustrating an operation for calculating the first insulation resistance and the second insulation resistance based on the first convergence value and the second convergence value by the insulation resistance calculation apparatus according to an embodiment of the present disclosure.

Referring to FIG. 13, a circuit C11 in which stray capacitance $C_{P(+)}$, $C_{P(-)}$ is removed from the first circuit CC1 is shown. Additionally, referring to FIG. 14, a circuit C12 in which stray capacitance $C_{P(+)}$, $C_{P(-)}$ is removed from the second circuit CC2 is shown.

The case in which the first convergence value and the second convergence value were estimated signifies that the first detection voltage and the second detection voltage do not change any longer due to the stray capacitance $C_{P(+)}$, $C_{P(-)}$ and reach the stable state, and thus the first circuit CC1 may be replaced with a circuit CC11, and the second circuit CC2 may be replaced with a circuit CC12.

The first circuit equation for the circuit CC11 may be represented by the following Equation 10, and the second circuit equation for the circuit CC12 may be represented by the following Equation 11.

$$V_{Bat} = \left(\frac{V_1}{R_2}\right)R_1 + V_1 + \left(\frac{V_1}{R_2} + \frac{\left(\frac{V_1}{R_2}\right)R_1 + V_1}{R_{Leak(+)}}\right)R_{Leak(-)} \quad \text{[Equation 10]}$$

$$V_{Bat} = \left(\frac{V_{DC} - V_2}{R_2}\right)R_1 - V_2 + \quad \text{[Equation 11]}$$
$$\left(\frac{V_{DC} - V_2}{R_2} + \frac{\left(\frac{V_{DC} - V_2}{R_2}\right)R_1 - V_2}{R_{Leak(-)}}\right)R_{Leak(+)}$$

In Equation 10 and Equation 11, R1 is equal to the resistance value of the first protective resistor R11 and the second protective resistor R21, R2 is equal to the resistance value of the first reference resistor R12 and the second reference resistor R22, $V_{Bat}$ is the voltage value of the battery, V1 is the first convergence value, and V2 is the second convergence value.

In the variables of Equation 10 and Equation 11, R1 and R2 are a preset value, V1, V2 and $V_{Bat}$ is a value estimated by the voltage estimating unit 162, and thus, only the first insulation resistance $R_{Leak(+)}$ and the second insulation resistance $R_{Leak(-)}$ are unknown. When Equation 10 and Equation 11 are written with respect to the first insulation resistance $R_{Leak(+)}$ and the second insulation resistance $R_{Leak(-)}$, the following Equation 12 is given.

$$R_{Leak(+)} = \frac{(V_{Bat} - A)(V_{Bat} - C) - AC}{D(V_{Bat} - A) + BC} \quad \text{[Equation 12]}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

The insulation resistance calculating unit 163 may define each value of the first insulation resistance $R_{Leak(+)}$ and the second insulation resistance $R_{Leak(-)}$ of the battery 20 by substituting the first convergence value and the second convergence value for V1 and V2 of Equation 12 respectively.

The insulation resistance calculating unit 163 may determine if insulation breakdown occurred in the battery 20 by comparing each of the calculated first insulation resistance $R_{Leak(+)}$ and second insulation resistance $R_{Leak(-)}$ with a preset reference value. That is, when at least one of the calculated first insulation resistance $R_{Leak(+)}$ and second insulation resistance $R_{Leak(-)}$ is equal to or lower than the reference value, the insulation resistance calculating unit 163 may determine that the battery 20 is in leakage state.

Specifically, when the first insulation resistance $R_{Leak(+)}$ is equal to or lower than the reference value, the insulation resistance calculating unit 163 may determine that insulation breakdown occurred on the side of the positive electrode terminal of the battery 20, and when the second insulation resistance $R_{Leak(-)}$ is equal to or lower than the reference value, determine that insulation breakdown occurred on the side of the negative electrode terminal of the battery 20.

When the battery 20 is determined to be in leakage state, the insulation resistance calculating unit 163 may output an alarm signal including information for notifying that the battery 20 is in leakage state (i.e., insulation breakdown). Additionally, the alarm signal may include even information associated with which of the first insulation resistance $R_{Leak(+)}$ and the second insulation resistance $R_{Leak(-)}$ is equal to or lower than the reference value.

According to another aspect of the present disclosure, the insulation resistance calculation apparatus 100 may be included in the battery pack 10. That is, the battery pack 10 according to another aspect of the present disclosure may include the insulation resistance calculation apparatus 100.

Additionally, according to still another aspect of the present disclosure, the insulation resistance calculation apparatus 100 may be included in an electric vehicle. That is, the electric vehicle according to still another aspect of the present disclosure may include the insulation resistance calculation apparatus 100. Here, the electric vehicle is a transportation means using electrical energy as a source of power, and includes an electric vehicle as well as hybrid vehicle.

Hereinafter, an insulation resistance calculation method according to another aspect of the present disclosure will be described. The description of the insulation resistance calculation apparatus described above may apply to the insulation resistance calculation method according to another aspect of the present disclosure, and a repeated description is omitted herein.

The insulation resistance calculation method according to an aspect of the present disclosure is a method for measuring the insulation resistance using the insulation resistance calculation apparatus described above, and each step of the insulation resistance calculation method may be performed by each element of the insulation resistance calculation apparatus described above.

Figure 15:
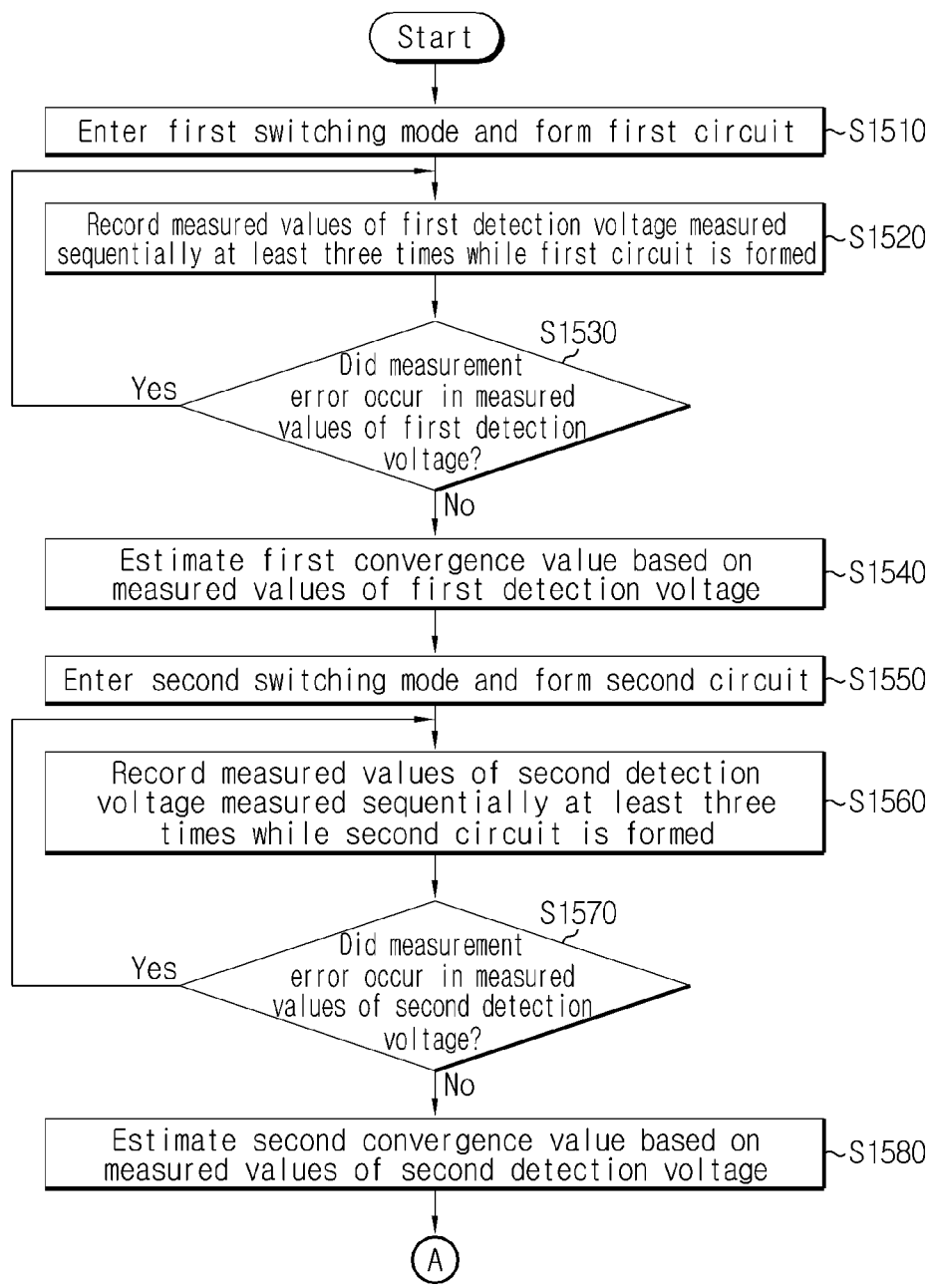
FIGS. 15 and 16 are flowcharts showing an insulation resistance calculation method according to an embodiment of the present disclosure.
Figure 16:
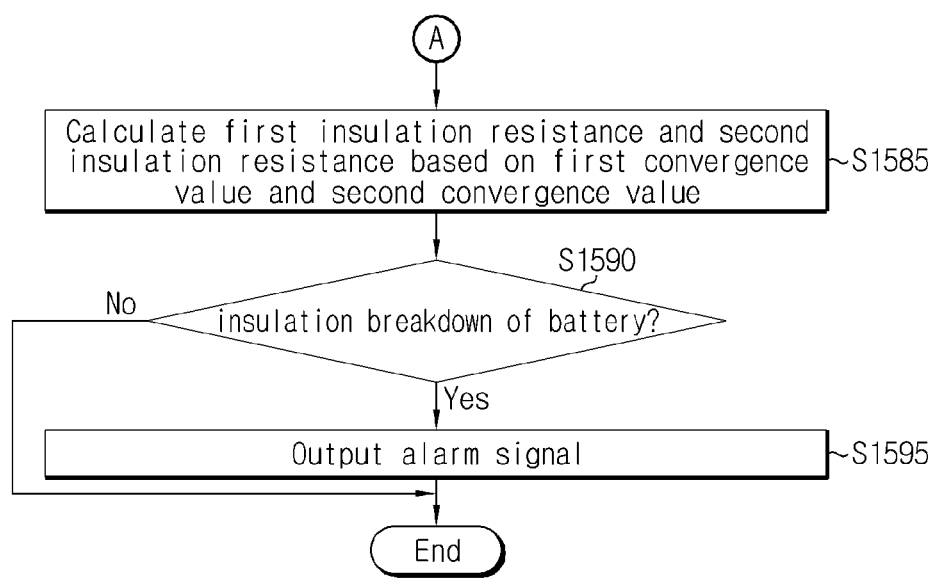

FIGS. 15 and 16 are flowcharts showing an insulation resistance calculation method according to an embodiment of the present disclosure.

First, referring to FIG. 15, at S1510, the processor 160 forms a first circuit CC1 by controlling the switching unit 130. Specifically, the processor 160 enters the first switching mode, and turns on the first switch SW1 and turns off the second switch SW2 to form a first circuit CC1.

At S1520, the processor 160 records the measured values of first detection voltage measured sequentially at least three times by the voltage measuring unit 150 while the first circuit CC1 is formed.

At S1530, the processor 160 determines if a measurement error occurred in the measured values of first detection voltage recorded through S1520.

At S1540, the processor 160 estimates a first convergence value based on the recorded measured values of first detection voltage.

At S1550, the processor 160 forms a second circuit CC2 by controlling the switching unit 130. Specifically, the processor 160 enters the second switching mode, and turns off the first switch SW1 and turns on the second switch SW2 to form a second circuit CC2.

At S1560, the processor 160 records the measured values of second detection voltage measured sequentially at least three times by the voltage measuring unit 150 while the second circuit CC2 is formed.

At S1570, the processor 160 determines if a measurement error occurred in the measured values of second detection voltage recorded through S1550.

At S1580, the processor 160 estimates a second convergence value based on the recorded measured values of second detection voltage.

Although FIG. 15 shows that S1510, S1520, S1530 and S1540 precede S1550, S1560, S1570 and S1580, the present disclosure is not limited to this order.

When S1540 and S1580 are finished, the method goes to S1585.

At S1585, the processor 160 calculates first insulation resistance $R_{Leak(+)}$ and second insulation resistance $R_{Leak(-)}$ based on the first convergence value and the second convergence value.

At S1590, the processor 160 determines if insulation breakdown occurred in the battery 20 based on the first insulation resistance $R_{Leak(+)}$ and the second insulation resistance $R_{Leak(-)}$.

At S1595, the processor 160 outputs an alarm signal when it is determined that insulation breakdown occurred in the battery 20 through S1590. The alarm signal outputted from the processor 160 may be converted to a user recognizable format (e.g., image, audio) by an output device provided in the insulation resistance calculation apparatus 100 and/or an external apparatus (e.g., vehicle).

The above steps shown in FIGS. 15 and 16 may be iteratively performed every preset operation cycle.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

Certain features described in the context of respective embodiments may be implemented in combination in a single embodiment. Conversely, various features described in the context of a single embodiment can be also implemented in various embodiments separately or in any suitable subcombination.

What is claimed is:

1. An insulation resistance calculation apparatus, comprising:
    a switching unit including a first switch and a second switch that are independently controlled;
    a first protective resistor and a first reference resistor connected in series between a positive electrode terminal of a battery and a ground when the first switch is turned on;
    a second protective resistor and a second reference resistor connected in series between a negative electrode terminal of the battery and the ground when the second switch is turned on;
    a voltage measuring unit configured to measure a first detection voltage applied to the first reference resistor and a second detection voltage applied to the second reference resistor; and
    a processor configured to control the first switch and the second switch according to a preset rule, to record measured values of the first detection voltage and measured values of the second detection voltage, and to calculate first insulation resistance between the positive electrode terminal of the battery and the ground and second insulation resistance between the negative electrode terminal of the battery and the ground, wherein the processor is configured to:
record the measured values of the first detection voltage measured sequentially at least three times by the voltage measuring unit in a first switching mode in which the first switch is turned on and the second switch is turned off,
record the measured values of the second detection voltage measured sequentially at least three times by the voltage measuring unit in a second switching mode in which the first switch is turned off and the second switch is turned on,
determine if a measurement error occurred in the first switching mode, based on at least two of the measured values of the first detection voltage recorded in the first switching mode,
determine if a measurement error occurred in the second switching mode, based on at least two of the measured values of the second detection voltage recorded in the second switching mode,
estimate a convergence value of the first detection voltage based on the measured values of the first detection voltage recorded in the first switching mode, when it is determined that a measurement error did not occur in the first switching mode,
estimate a convergence value of the second detection voltage based on the measured values of the second detection voltage recorded in the second switching mode, when it is determined that a measurement error did not occur in the second switching mode, and
calculate the first insulation resistance and the second insulation resistance based on the convergence value of the first detection voltage and the convergence value of the second detection voltage.

2. The insulation resistance calculation apparatus according to claim 1, wherein the voltage measuring unit is configured to:
measure the first detection voltage sequentially at least three times every preset first time in the first switching mode, and
measure the second detection voltage sequentially at least three times every preset second time in the second switching mode.

3. The insulation resistance calculation apparatus according to claim 1, wherein the measured values in the first switching mode include a first measured value, a second measured value after the first measured value, and a third measured value after the second measured value, and
the processor is configured to:
determine that a measurement error occurred in the first switching mode, when the first measured value is equal to or lower than the second measured value or the second measured value is equal to or lower than the third measured value.

4. The insulation resistance calculation apparatus according to claim 1, wherein the measured values in the second switching mode include a fourth measured value, a fifth measured value after the fourth measured value, and a sixth measured value after the fifth measured value, and
the processor is configured to
determine that a measurement error occurred in the second switching mode, when the fourth measured value is equal to or lower than the fifth measured value or the fifth measured value is equal to or less than the sixth measured value.

5. The insulation resistance calculation apparatus according to claim 1, wherein the measured values in the first switching mode include a first measured value, a second measured value after the first measured value, and a third measured value after the second measured value, and
the processor is configured to:
determine that a measurement error occurred in the first switching mode, when an absolute value of a slope of a first straight line connecting the first measured value and the second measured value is equal to or lower than an absolute value of a slope of a second straight line connecting the second measured value and the third measured value.

6. The insulation resistance calculation apparatus according to claim 1, wherein the measured values in the second switching mode include a fourth measured value, a fifth measured value the fourth measured value, and a sixth measured value after the fifth measured value, and
the processor is configured to:
determine that a measurement error occurred in the second switching mode, when an absolute value of a third straight line slope connecting the fourth measured value and the fifth measured value is equal to or lower than an absolute value of a fourth straight line slope connecting the fifth measured value and the sixth measured value.

7. The insulation resistance calculation apparatus according to claim 1, wherein the processor is configured to:
re-execute the first switching mode when it is determined that a measurement error occurred in the first switching mode, and
re-execute the second switching mode when it is determined that a measurement error occurred in the second switching mode.

8. The insulation resistance calculation apparatus according to claim 1, further comprising:
a direct current voltage source connected between the second reference resistor and the ground.

9. The insulation resistance calculation apparatus according to claim 1, wherein the processor is configured to:
measure the first detection voltage and the second detection voltage in a third switching mode in which the first switch is turned on and the second switch is turned on, and
calculate the first insulation resistance and the second insulation resistance, further based on the measured value of the first detection voltage and the measured value of the second detection voltage in the third switching mode.

10. A method for calculating insulation resistance using an insulation resistance calculation apparatus comprising a switching unit including a first switch and a second switch that are independently controlled, a first protective resistor and a first reference resistor connected in series between a positive electrode terminal of a battery and a ground when the first switch is turned on, a second protective resistor and a second reference resistor connected in series between a negative electrode terminal of the battery and the ground when the second switch is turned on, a voltage measuring unit configured to measure a first detection voltage applied to the first reference resistor and a second detection voltage applied to the second reference resistor, and a processor configured to control the first switch and the second switch according to a preset rule, to record measured values of the first detection voltage and measured values of the second detection voltage, and to calculate first insulation resistance between the positive electrode terminal of the battery and the ground and second insulation resistance between the negative electrode terminal of the battery and the ground, the insulation resistance calculation method comprising:
- measuring, by the processor, the first detection voltage sequentially at least three times in a first switching mode the first switch is turned on and the second switch is turned off;
- measuring, by the processor, the second detection voltage sequentially at least three times in a second switching mode in which the first switch is turned off and the second switch is turned on;
- determining, by the processor, if a measurement error occurred in the first switching mode, based on at least two of the measured values in the first switching mode;
- determining, by the processor, if a measurement error occurred in the second switching mode, based on at least two of the measured values in the second switching mode;
- estimating, by the processor, a convergence value of the first detection voltage based on the measured values in the first switching mode when it is determined that a measurement error did not occurred in the first switching mode;
- estimating, by the processor, a convergence value of the second detection voltage based on the measured values in the second switching mode, when it is determined that a measurement error did not occurred in the second switching mode; and
- calculating, by the processor, the first insulation resistance and the second insulation resistance based on the convergence value of the first detection voltage and the convergence value of the second detection voltage.

\* \* \* \* \*